(12) United States Patent  (10) Patent No.: US 7,453,290 B2
Woo et al.  (45) Date of Patent: Nov. 18, 2008

(54) SUPPLY VOLTAGE REMOVAL DETECTING CIRCUIT, DISPLAY DEVICE AND METHOD FOR REMOVING LATENT IMAGE

(75) Inventors: Jae-hyuck Woo, Osan-si (KR); Jae-goo Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 141 days.

(21) Appl. No.: 11/542,593

(22) Filed: Oct. 3, 2006

(65) Prior Publication Data

US 2007/0075750 A1  Apr. 5, 2007

(30) Foreign Application Priority Data

Oct. 4, 2005  (KR) ...................... 10-2005-0093056

(51) Int. Cl.
H03K 5/22 (2006.01)
(52) U.S. Cl. .............................. 327/72; 327/78; 361/92
(58) Field of Classification Search ................... 327/72, 327/78; 361/92
See application file for complete search history.

(56) References Cited

U.S. PATENT DOCUMENTS 4,266,145 A * 5/1981 Amacher et al. ............. 327/198

6,310,497 B1 * 10/2001 Strauss ....................... 327/143
7,281,151 B2 * 10/2007 Miyake et al. .............. 713/340

FOREIGN PATENT DOCUMENTS

| JP | 11-271707 | 10/1999 |
|---|---|---|
| JP | 2004-226597 | 8/2004 |
| KR | 1020030029729 A | 4/2003 |

* cited by examiner

Primary Examiner—Kenneth B. Wells
(74) Attorney, Agent, or Firm—F. Chau & Assoc., LLC (57) ABSTRACT

A supply voltage removal detecting circuit, a display device and method for removing a latent image when a supply voltage is disconnected, in which the supply voltage removal detecting circuit includes a voltage controller, a detection signal generator, and an output unit. The voltage controller controls voltages such that when a first supply voltage and a second supply voltage stay at a first level, the voltage at a first node is greater than the voltage at a second node, and when the first supply voltage or the second supply voltage becomes a second level, the voltage at the second node stays at a specific level, and the voltage at the first node is less than the specific level. The detection signal generator generates a detection signal by comparing the voltage at the first node with the voltage at the second node. The output unit prevents the voltage controller and the detection signal generator from faulty operations, and inverts the detection signal in response to an operation enabling signal to output a detection control signal.

12 Claims, 5 Drawing Sheets

SUPPLY VOLTAGE REMOVAL DETECTING CIRCUIT, DISPLAY DEVICE AND METHOD FOR REMOVING LATENT IMAGE

CROSS-REFERENCE TO RELATED PATENT APPLICATION

This application claims the benefit of Korean Patent Application No. 10-2005-0093056, filed on 4 Oct. 2005, in the Korean Intellectual Property Office, the disclosure of which is incorporated herein in its entirety by reference.

BACKGROUND OF THE INVENTION

1. Technical Field

The present disclosure relates to a supply voltage removal detecting circuit and a display device having the same, and more particularly, to a display device that can promptly remove a latent image displayed on a panel when a battery is disconnected from the display device whose gate drivers cannot be concurrently turned on, and a method thereof.

2. Discussion of the Related Art

In passive matrix type display devices, when a supply voltage is disconnected, a driving voltage for a panel is discharged using a discharging circuit to remove a latent image displayed on the panel. In other words, when a battery is disconnected, the driving voltage applied to the panel is discharged to remove the latent image displayed on the panel.

The driving voltages for driving the panel that are discharged when the battery is disconnected include driving voltages to control the gate lines of the panel, and the driving voltage output by a source driver. The supply power is boosted to generate the driving voltage to control one of the gate lines and the driving voltage output from the source driver, and dropped to generate the negative driving voltage to control the other one of the gate lines.

In this case, a negative voltage is used to turn off the gate lines of the panel. If the negative voltage VGOFF changes from a negative voltage to a ground voltage due to the discharge, the gate lines of the panel allow a constant current to flow even though they are not completely turned on.

In this state, if the output voltage of the source driver is discharged to the ground voltage, the electric charge stored in a capacitor of the panel is discharged. As a result, the latent image displayed on the panel is removed, and a black and white image is displayed on the panel according to the panel properties.

Unlike passive matrix type display devices, in active matrix type display devices, for example, TFT-LCDs, when the battery for generating the supply voltage is disconnected, the latent image is displayed on the panel for a specific time, and then slowly disappears from the panel.

Thus, since active matrix type display devices do not discharge the driving voltages, the latent image is not removed promptly from the panel when the battery is disconnected.

SUMMARY OF THE INVENTION

An exemplary embodiment of the present invention provides a supply voltage removal detecting circuit that can recognize that a battery is disconnected.

An exemplary embodiment of the present invention provides a supply voltage removal detecting method that can recognize that a battery is disconnected.

An exemplary embodiment of the present invention provides a display device that can promptly remove a latent image displayed on a panel by using a supply voltage removal detecting circuit when a battery is disconnected from the display device whose gate drivers cannot be concurrently turned on.

An exemplary embodiment of the present invention provides a method that can promptly remove a latent image displayed on a panel by using a supply voltage removal detecting circuit when a battery is disconnected from the display device whose gate drivers cannot be concurrently turned on.

According to an exemplary embodiment of the present invention, there is provided a supply voltage removal detecting circuit comprising a voltage controller, a detection signal generator, and an output unit. The voltage controller controls voltages such that when a first supply voltage and a second supply voltage stay at a first level, the voltage at a first node is greater than the voltage at a second node, and when the first supply voltage or the second supply voltage becomes a second level, the voltage at the second node stays at a specific level, and the voltage at the first node is less than the specific level. The detection signal generator generates a detection signal by comparing the voltage at the first node with the voltage at the second node in response to a boost voltage. The output unit prevents faulty operation of the voltage controller and the detection signal generator and inverts the detection signal in response to an operation enabling signal to output a detection control signal.

The first supply voltage and the second supply voltage are generated by a battery, and when the battery is disconnected, the first supply voltage and the second supply voltage become the second level after a time delay.

The detection signal generator outputs the detection signal at the second level when the voltage at the first node is greater than the voltage at the second node, and outputs the detection signal at the first level when the voltage at the first node is less than the voltage at the second node.

The voltage controller comprises first to fourth resistors, first to fourth transistors, and a capacitor. One end of the first resistor is connected to a first supply voltage. The first transistor receives a second supply voltage through its gate and has a first end connected to a first node. The second resistor is connected in series between the other end of the first resistor and a second end of the first transistor. One end of the third resistor is connected to the first node. A gate and a first end of the second transistor are connected to the other end of the third resistor. One end of the fourth resistor is connected to a second end of the second transistor and the other end thereof is connected to a ground voltage. A gate of the third transistor is connected to a node where the first resistor and the second resistor are connected and a first end thereof is connected to the other end of the third resistor. The fourth transistor receives a second supply voltage through its gate and has a first end connected to a second end of the third transistor and a second end connected to a second node. The capacitor is connected between the second node and the ground voltage.

The capacitor is located in the supply voltage removal detecting circuit, and is charged in response to the voltage at the second node when the first supply voltage and the second supply voltage stay at the first level, and the voltage at the second node stays at the specific level when the first supply voltage or the second supply voltage becomes the second level.

The detection signal generator comprises a comparator that operates in response to the boost voltage and that has a negative node connected to the first node and a positive node connected to the second node, thereby generating the detection signal.

The output unit comprises a down shifting unit, a delay unit, a NOR gate, an AND gate, and an inverter. The down shifting unit reduces the voltage of the detection signal. The delay unit delays the output of the down shifting unit. The NOR gate performs a NOR operation on the output of the delay unit and the output of the down shifting unit. The AND gate performs an AND operation on the operation enabling signal and the output of the NOR gate. The inverter inverts the output of the AND gate to output the detection control signal.

The down shifting unit comprises an inverter that inverts the detection signal and operates in response to the second supply voltage.

According to an exemplary embodiment of the present invention, there is provided a supply voltage removal detecting method comprising: controlling voltages such that when a first supply voltage and a second supply voltage generated by a battery stay at a first level, the voltage at a first node is greater than the voltage at a second node, and when the first supply voltage or the second supply voltage becomes a second level, the voltage at the second node stays at a specific level, and the voltage at the first node is less than the specific level; generating a detection signal by comparing the voltage at the first node with the voltage at the second node in response to a boost voltage; and outputting a detection control signal by inverting the detection signal in response to an operation enabling signal.

When the battery is disconnected, the first supply voltage and the second supply voltage become the second level after a time delay.

In an exemplary embodiment of the present invention, the step of controlling voltages further comprises: charging a capacitor connected between the second node and the ground voltage in response to the voltage at the second node when the first supply voltage and the second supply voltage stay at the first level; and maintaining the voltage at the second node at a constant level corresponding to the amount of electric charge stored in the capacitor when the first supply voltage or the second supply voltage becomes the second level.

In an exemplary embodiment of the present invention, the step of outputting a detection control signal further comprises: delaying the detection signal; performing a NOR operation on the detection signal and the delayed detection signal; performing an AND operation on the operation enabling signal and the signal processed by the NOR operation; and outputting the detection control signal by inverting the signal processed by the OR operation.

According to an exemplary embodiment of the present invention, there is provided a display device for removing a latent image displayed on a panel when a battery is disconnected, comprising a panel and a driving unit that controls the panel to display an image on the panel. The driving unit comprises a supply voltage, a voltage booster, a microprocessor, and a source driver. The supply voltage removal detector generates a detection control signal at a second level when the battery that supplies the supply voltage to the driving unit and the panel is disconnected. The voltage booster stops generating a boost voltage applied to the panel in response to the detection control signal. The microprocessor interrupts control signals received by the driving unit in response to the detection control signal. The source driver makes the voltage at the output node of each source line of the panel equal to the ground voltage in response to the detection control signal. The panel comprises a gate driver that alternately activates gate lines of the panel in a specific order in response to the detection control signal.

The panel makes a reference voltage applied to an internal capacitor of the panel equal to the ground voltage in response to the detection control signal.

According to an exemplary embodiment of the present invention, there is provided a display device for removing a latent image displayed on a panel when a battery is disconnected, comprising a panel and a driving unit that controls the panel to display an image on the panel. The driving unit comprises a supply voltage removal detector, a voltage booster, a microprocessor, a source driver, and a gate driver. The supply voltage removal detector generates a detection control signal at a second level when the battery that supplies the supply voltage to the driving unit and the panel is disconnected. The voltage booster stops generating a boost voltage applied to the panel in response to the detection control signal. The microprocessor interrupts control signals received by the driving unit in response to the detection control signal. The source driver makes the voltage at the output node of each source line of the panel equal to the ground voltage in response to the detection control signal. The gate driver alternately activates gate lines of the panel in a specific order in response to the detection control signal.

The panel makes a reference voltage applied to an internal capacitor of the panel equal to the ground voltage in response to the detection control signal.

According to an exemplary embodiment of the present invention, there is provided a method of removing a latent image displayed on a panel of a display device when a battery is disconnected from the display device that includes a panel and a driving unit that displays an image on the panel by controlling the panel, the method comprising: generating a detection control signal at a second level when the battery is disconnected; stopping generating a boost voltage applied to the panel in response to the detection control signal; interrupting control signals received by the driving unit in response to the detection control signal; and discharging a capacitor of the panel by alternately activating gate lines of the panel in a specific order.

In addition, the discharging of the capacitor comprises: making the voltage at the output node of each of the source lines of the panel equal to the ground voltage in response to the detection control signal; making a reference voltage applied to an internal capacitor of the panel equal to the ground voltage in response to the detection control signal; and activating the gate lines of the panel alternately in a specific order in response to the detection control signal.

The panel includes a gate driver, and the panel is an active matrix type panel.

BRIEF DESCRIPTION OF THE DRAWINGS

Exemplary embodiments of the present invention will be understood in more detail from the following descriptions taken in conjunction with the attached drawings in which.

DETAILED DESCRIPTION OF EXEMPLARY EMBODIMENTS

The attached drawings illustrate exemplary embodiments of the present invention and are referred to in order to gain a sufficient understanding of the present invention and its merits and objectives.

The present invention will now be described in detail by explaining exemplary embodiments of the invention with reference to the attached drawings. Like reference numerals denote like elements in the drawings.

Figure 1:
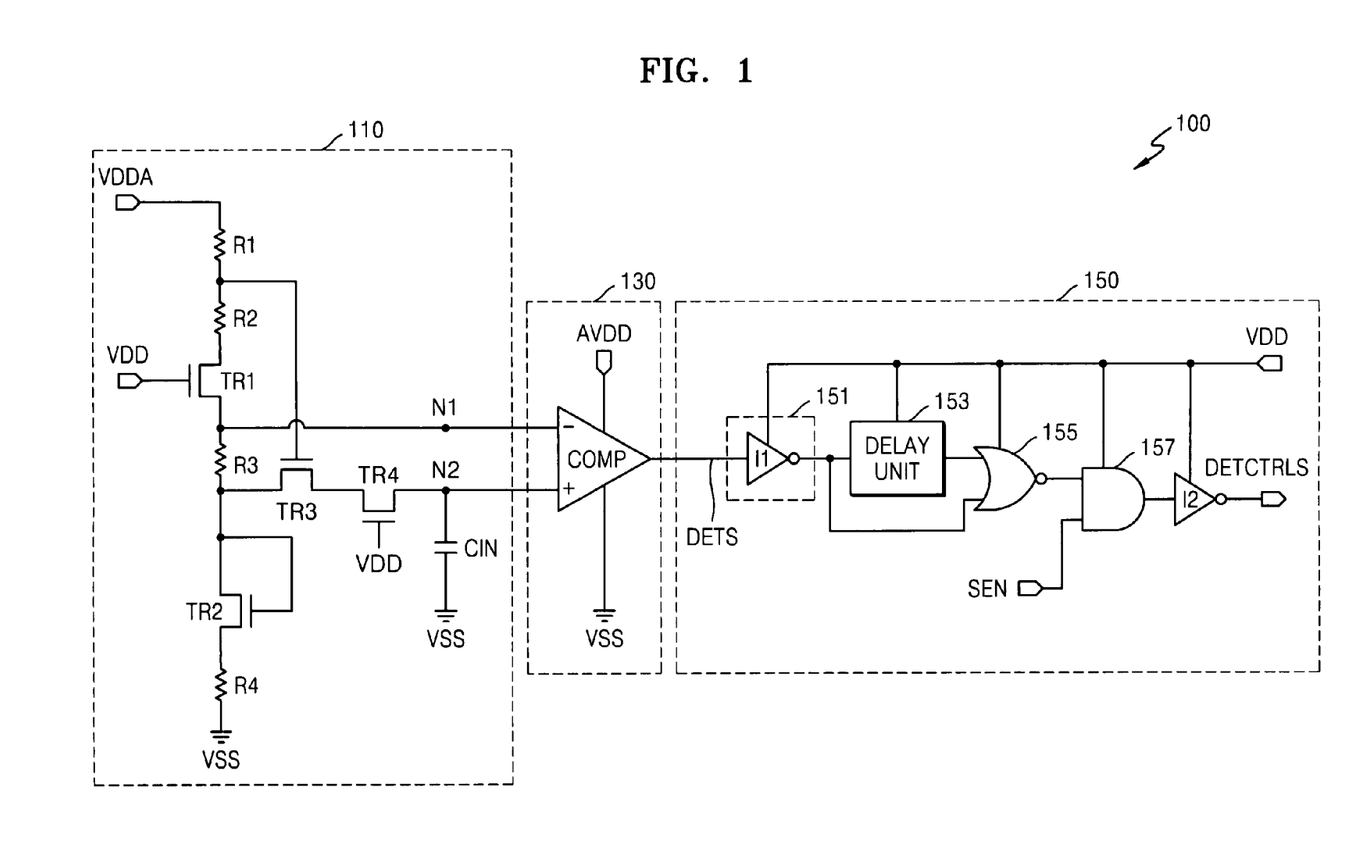
FIG. 1 is a circuit diagram of a supply voltage removal detecting circuit according to an exemplary embodiment of the present invention.

FIG. 1 is a view of a supply voltage removal detecting circuit according to an exemplary embodiment of the present invention.

The supply voltage removal detecting circuit 100 of FIG. 1 maintains a uniform voltage at the positive node of a comparator COMP, which is a second node N2, using an internal capacitor CIN for the supply voltage removal detecting circuit 100, instead of controlling the slope of a signal input to the positive node of the comparator COMP.

Referring to FIG. 1, the supply voltage removal detecting circuit 100 includes a voltage controller 110, a detection signal generator 130, and an output unit 150.

The voltage controller 110 controls voltages such that when a first supply voltage VDDA and a second supply voltage VDD stay at a first level, the voltage at a first node N1 is greater than the voltage at a second node N2.

Meanwhile, the voltage controller 110 controls voltages such that when the first supply voltage VDDA or the second supply voltage VDD becomes a second level, the voltage at the second node N2 stays at a specific level, and the voltage at the first node N1 is less than the specific level. For convenience, it is assumed that the first level is a high level, and the second level is a low level.

A battery generates the first supply voltage VDDA and the second supply voltage VDD. The first supply voltage VDDA is an analog voltage, and is slightly greater than the second supply voltage VDD. The second supply voltage VDD is used to control logic levels of the supply voltage removal detecting circuit 100.

When the battery is disconnected, the first supply voltage VDDA and the second supply voltage VDD become the second level after a time delay. Namely, when the battery is disconnected, one of the first supply voltage VDDA and the second supply voltage VDD drops to the second level, and then the other also drops to the second level.

Unlike the conventional supply voltage removal detecting circuit, the supply voltage removal detecting circuit 100 of an exemplary embodiment of the present invention can detect the removal of the battery regardless of which voltage first drops to the second level.

The voltage controller 110 will now be described in detail with reference to FIG. 1. The voltage controller 110 includes first to fourth resistors R1 to R4, first to fourth transistors TR1 to TR4, and a capacitor CIN.

One end of the first resistor R1 is connected to the first supply voltage VDDA. The first transistor TR1 receives the second supply voltage VDD through its gate, and a first end of the first transistor TR1 is connected to the first node N1.

The second resistor R2 is connected in series between the other end of the first resistor R1 and a second end of the first transistor TR1. One end of the third resistor R3 is connected to the first node N1.

A gate and a first end of the second transistor TR2 are connected to the other end of the third resistor R3. One end of the fourth resistor R4 is connected to a second end of the second transistor TR2, and the other end of the fourth resistor R4 is connected to a ground voltage VSS.

A gate of the third transistor TR3 is connected to a node where the first resistor R1 and the second resistor R2 are connected, and a first end of the third transistor TR3 is connected to the other end of the third resistor R3.

The fourth transistor TR4 receives the second supply voltage VDD through its gate. A first end of the fourth transistor TR4 is connected to a second end of the third transistor TR3, and a second end of the fourth transistor TR4 is connected to the second node N2.

The capacitor CIN is connected between the second node N2 and the ground voltage VSS, and is located in the supply voltage removal detecting circuit 100.

When the first supply voltage VDDA and the second supply voltage VDD are at the first level, the capacitor CIN is charged by the voltage at the second node N2. Meanwhile, when the first supply voltage VDDA or the second supply voltage VDD changes to the second level, the voltage at the second node N2 stays at a constant level corresponding to the amount of the electrical charge stored in the capacitor CIN.

The detection signal generator 130 operates in response to a boost voltage AVDD. The detection signal generator 130 compares the voltage at the first node N1 with the voltage at the second node N2 to generate a detection signal DETS.

The detection signal generator 130 outputs the detection signal DETS at the second level when the voltage at the first node N1 is greater than the voltage at the second node N2, and outputs the detection signal DETS at the first level when the voltage at the first node N1 is less than the voltage at the second node N2.

The detection signal generator 130 includes a comparator COMP that operates in response to the boost voltage AVDD to generate the detection signal DETS, and that has a negative input connected to the first node N1 and a positive input connected to the second node N2.

The operation of the voltage controller 110 and the detection signal generator 130 will now be described.

When the supply voltage removal detecting circuit 100 is placed in a display device (not shown) including a panel, the boost voltage AVDD drives the display device. The boost voltage AVDD is generated by boosting a supply voltage through a voltage booster (not shown) for the display device (not shown).

When the display device (not shown) is in a stand-by mode or a sleep mode, the second supply voltage VDD stays at the second level, that is, the low level, and turns off the first and fourth transistors TR1 and TR4. In this way, current consumption can be reduced without having to operate the supply voltage removal detecting circuit 100.

The display device operates normally after the boost voltage AVDD is generated. After the boost voltage AVDD is generated, the boost voltage AVDD becomes the second supply voltage, or the high level, to turn on the first and fourth transistors TR1 and TR4. Thus, the supply voltage removal detecting circuit 100 can recognize whether the battery is disconnected from the display device.

When the battery (not shown) is reapplied to the display device and, thus, to the supply voltage removal detecting circuit 100, and the first supply voltage VDDA and the second supply voltage VDD operate normally, the first to fourth transistors TR1 to TR4 are turned on, and the voltages at the first node N1 and the second node N2 are determined according to the resistances of the first to fourth resistors R1 to R4. At this time, the voltage at the first node N1 is greater than the voltage at the second node N2. Thus, the comparator COMP generates the detection signal DETS at the low level.

The first to fourth resistors R1 to R4 divide the first supply voltage VDDA according to their resistance ratio, and the divided voltage is the threshold voltage for the first and second transistors TR1 and TR2. The first to fourth resistors R1 to R4 control the voltages at both inputs of the comparator COMP.

The output unit 150 prevents the voltage controller 110 and the detection signal generator 130 from fault operations. Further, the output unit 150 inverts the detection signal DETS in response to an operation enabling signal SEN and outputs the inversion result as a detection control signal DETCTRLS.

Referring to FIG. 1, the output unit 150 includes a down shifting unit 151, a delay unit 153, a NOR gate 155, an AND gate 157, and an inverter 159. The down shifting unit 151 reduces the voltage of the detection signal DETS.

The down shifting unit 151 includes an inverter I1 inverting the detection signal DETS. The inverter I1 operates in response to the second supply voltage VDD.

Since the comparator COMP operates in response to the boost voltage AVDD, the level of the detection signal DETS output from the comparator COMP is greater than the second supply voltage VDD that is used for logic supply voltage level of the supply voltage removal detecting circuit 100.

Therefore, the down shifting unit 151 reduces the level of the detection signal DETS to the second supply voltage VDD that can be used in logic operations.

The delay unit 153 delays the output of the down shifting unit 151. More specifically, the delay unit 153 prevents faulty operation when the inputs, or the first node 1 and the second node 2, of the comparator COMP fluctuate, and the output of the comparator COMP instantly becomes the high level.

In other words, while the first supply voltage VDDA and the second supply voltage VDD operate normally to generate the detection signal DETS at the low level, if the detection signal DETS instantly becomes the high level for a certain time due to faulty operation of the comparator COMP, the NOR gate 155 continues to output a signal at the low level. This is because a signal that is input to the NOR gate 155 via the delay unit 153 is at the low level, even through a signal that is directly input to the NOR gate 155 is at the high level.

Therefore, the faulty operation caused by instantaneous glitches of the first supply voltage VDDA or the second supply voltage VDD can be prevented by using the delay unit 153 and the NOR gate 155. To prevent faulty operation, the delay unit 153 can be set to selectively determine a delay time.

The AND gate 157 performs an AND operation on the operation enabling signal SEN and the output of the NOR gate 155. An inverter I2 inverts the output of the AND gate 157 and outputs the detection control signal DETCTRLS.

When the supply voltage removal detecting circuit 100 is utilized in the display device (not shown), the operation enabling signal SEN is activated to the first level when an image is displayed on the panel of the display device.

The operation enabling signal SEN is used to detect removal of the battery from the display device only after the image is displayed on the panel of the display device, because the removal of the battery does not affect the panel before the image is displayed on the panel.

Figure 2:
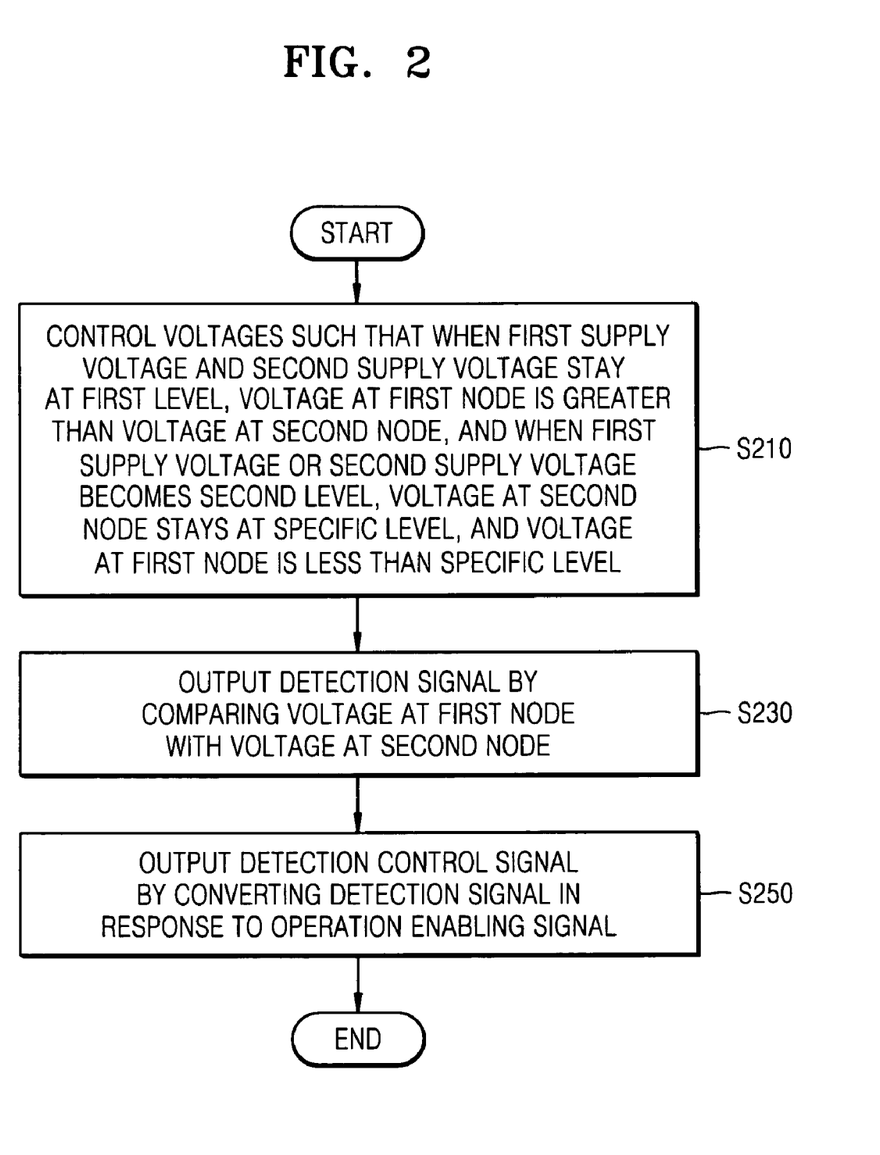
FIG. 2 is a flowchart illustrating the operation of the supply voltage removal detecting circuit of FIG. 1.

FIG. 2 is a flowchart illustrating the operation of the supply voltage removal detecting circuit 100 of FIG. 1. The operation of the supply voltage removal detecting circuit 100 will now be described in detail with reference to FIGS. 1 and 2.

In a supply voltage detecting method according to an exemplary embodiment of the present invention, the detection signal DETS at the second level is output when the first supply voltage VDDA and the second supply voltage VDD generated by the battery stay at the first level, and the detection signal DETS at the first level is output after detecting that the first supply voltage VDDA or the second supply voltage VDD has become the second level.

First, in the supply voltage detecting method, when the first supply voltage VDDA and the second supply voltage VDD stay at the first level, the voltage at the first node N1 is controlled to be greater than the voltage at the second node N2. Also, when the first supply voltage VDDA or the second supply voltage VDD becomes the second level, the voltage at the second node N2 is controlled to be a constant level, and the voltage at the first node N1 is controlled to be less than the voltage at the second node N2 (operation S210). The operation S210 is performed by the voltage controller 110 of FIG. 1.

The operation S210 will now be described in detail with reference to FIGS. 1 and 2. While the first supply voltage VDDA and the second supply voltage VDD stay at the first level, the first to fourth transistors TR1 to TR4 are all turned on. Thus, the voltage at the first node N1 is greater than the voltage at the second node N2 by the sum of the voltage applied to the third resistor R3 and the threshold voltage of the third and fourth transistors TR3 and TR4. Thus, the comparator COMP outputs the detection signal DETS at the second level (operation S230).

Meanwhile, while the first supply voltage VDDA and the second supply voltage VDD stay at the first level, the voltage at the second node N2 stays at a constant level. Namely, the voltage at the second node N2 is less than the first supply voltage VDDA by the sum of the voltage drop over the first to third resistors R1 to R3 and the threshold voltage of the first, third, and fourth transistors TR1, TR3, and TR4.

As a result, while the first supply voltage VDDA and the second supply voltage VDD stay at the first level, an electrical charge corresponding to the voltage level at the second node N2 is charged in the internal capacitor CIN.

The case when the battery is disconnected from the display device and the first supply voltage VDDA or the second supply voltage VDD becomes the second level will now be described. First, when the first supply voltage VDDA becomes the second level, the third transistor TR3 is turned off. In this case, the voltage at the first node N1 also becomes the second level.

Since the third transistor TR3 is turned off, the voltage at the second node N2 stays at a constant level corresponding to the electrical charge stored in the internal capacitor CIN. Thus, when the first supply voltage VDDA becomes the second level, the voltage at the second node N2 is greater than the voltage at the first node N1.

Meanwhile, when the second supply voltage VDD becomes the second level, the first and the fourth transistors TR1 and TR4 are turned off. Thus, the voltage at the first node N1 also becomes the second level.

Since the fourth transistor TR4 is turned off, the voltage at the second node N2 stays at a constant level corresponding to the electrical charge stored in the internal capacitor CIN. Thus, when the second supply voltage VDD becomes the second level, the voltage at the second node N2 is greater than the voltage at the first node N1.

When both the first supply voltage VDDA and the second supply voltage VDD become the second level, the first, third, and fourth transistors TR1, TR3, and TR4 are turned off. Thus, as in the case when the first supply voltage VDDA or the second supply voltage VDD becomes the second level, when the second supply voltage VDD becomes the second level, the voltage at the second node N2 is greater than the voltage at the first node N1.

Since the voltage at the second node N2 is greater than the voltage at the first node N1 when the first supply voltage VDDA or the second supply voltage VDD becomes the second level, the comparator COMP outputs the detection signal DETS of the first level.

The detection signal DETS output from the comparator COMP is inverted in response to the operation enabling signal SEN, and is then output as the detection control signal DETCTRLS (operation S250). The operation S250 is performed by the output unit 150 of FIG. 1.

An exemplary embodiment of the present invention provides a method in which gate lines are sequentially activated in a specific order, so that a latent image that is displayed on a panel can be removed when a supply voltage is disconnected, even though the panel cannot concurrently activate the gate lines or the panel includes a gate driver.

Figure 3:
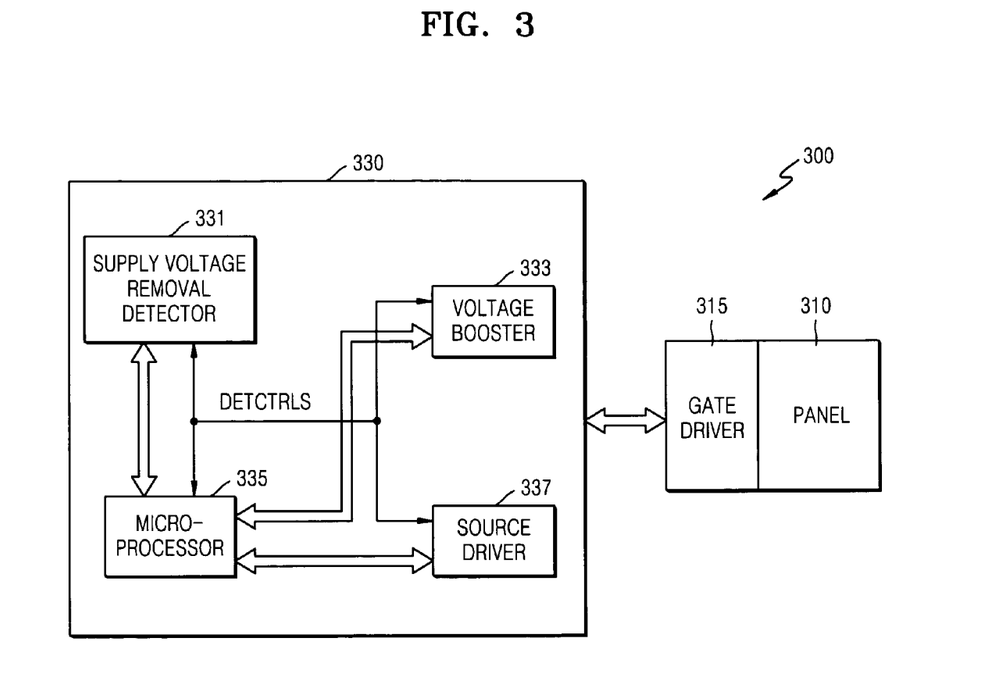
FIG. 3 is a block diagram of a display device according to an exemplary embodiment of the present invention.
Figure 4:
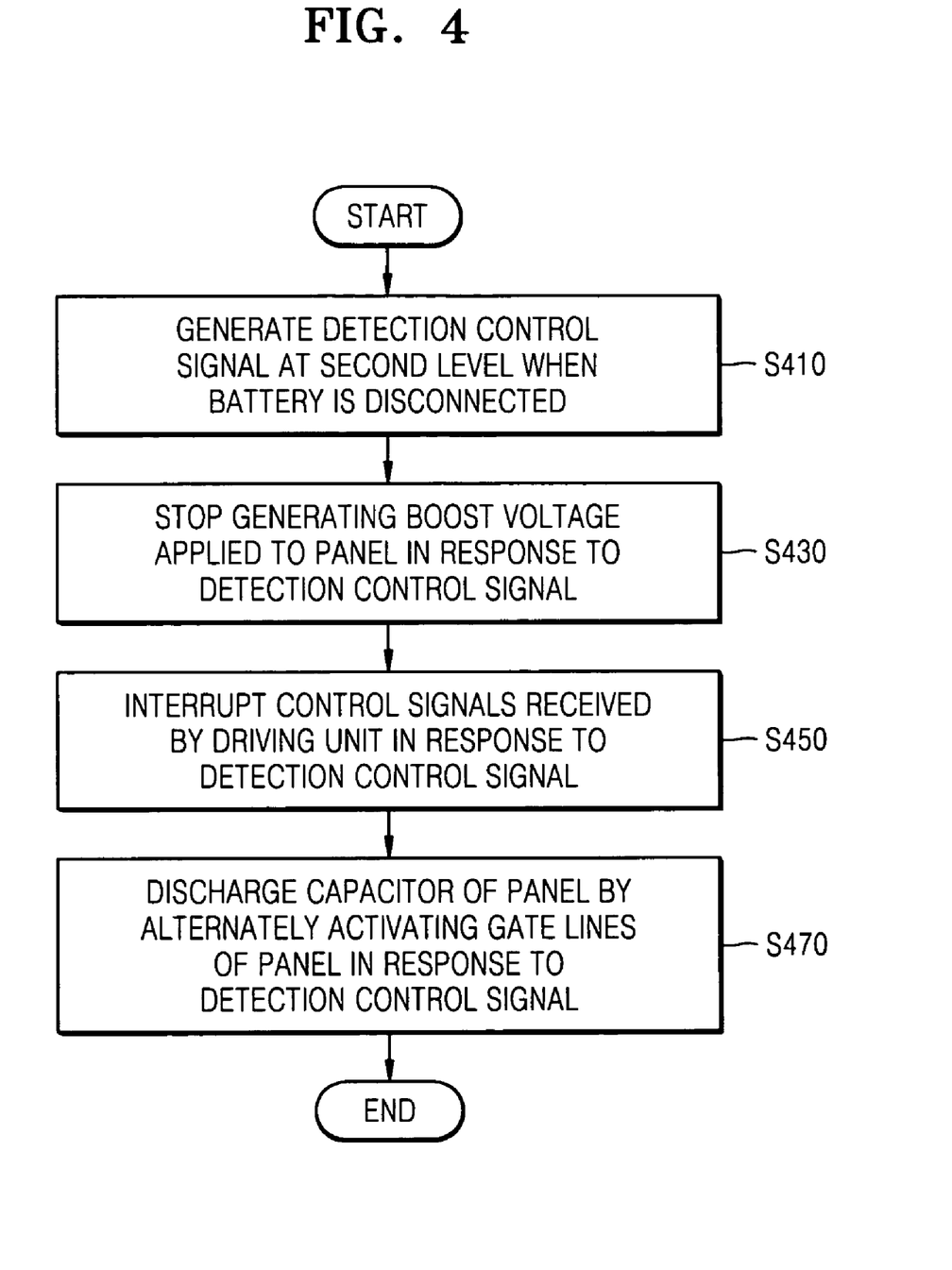
FIG. 4 is a flowchart illustrating the operation of the display device of FIG. 3.

FIG. 3 shows the structure of a display device according to an exemplary embodiment of the present invention. FIG. 4 is a flowchart illustrating the operation of the display device of FIG. 3. The display device for removing the latent image when the battery is disconnected and the method thereof according to an exemplary embodiment of the present invention will now be described with reference to FIGS. 3 and 4.

A display device 300 includes a panel 310, and a driving unit 330 that controls the panel 310 and displays an image on the panel 310. The driving unit 330 includes a supply voltage removal detector 331, a voltage booster 333, a microprocessor 335, and a source driver 337.

A gate driver 315 is included in the active matrix type panel 310. If the panel 310 includes the gate driver 315, gate lines of the panel 310 cannot be concurrently activated.

The supply voltage removal detector 331 detects whether the battery that supplies the supply voltage to the driving unit 330 and the panel 310 is disconnected, and generates the detection control signal DETCTRLS at the second level if it is detected that the battery is disconnected.

The voltage booster 333 generates a boost voltage and supplies the boost voltage to the other units of the driving unit 330 and the panel 310. If the battery is disconnected, the voltage booster 333 stops its operation and no longer generates the boost voltage.

The microprocessor 335 generates signals required for displaying an image on the panel 310 in response to an external control signal (not shown), and sends the signals to the other units of the driving unit 330 and the panel 310. The source driver 337 controls source lines of the panel 310, and the source driver 337 is controlled by the microprocessor 335.

Referring to FIG. 4, when the battery is disconnected, the detection control signal DETCTRLS of the second level is generated (operation S410). The operation S410 is performed by the supply voltage removal detector 331 of FIG. 3. The supply voltage removal detector 331 has the same structure and operation as the supply voltage removal detecting circuit 100. Thus, a description thereof will be omitted.

In addition, other circuits may be used in the display device 300 of the present invention, instead of the supply voltage removal detecting circuit 100 of FIG. 1, and this will be understood by those skilled in the art.

Next, in response to the detection control signal DETCTRLS, the boost voltage applied to the panel 310 is interrupted (operation S430). The operation S430 is performed by the voltage booster 333 of FIG. 3.

The voltage booster 333 generates the boost voltage while the detection control signal DETCTRLS stays at the first level. When the battery is disconnected, however, and the detection control signal DETCTRLS becomes the second level, then the voltage booster 333 stops its operation, and no longer generates the boost voltage.

In other words, when the battery is disconnected, the supply voltage is no longer supplied. Thus, the voltage booster 333 stops generating the boost voltage. The boost voltage is used for performing operations S450 and S470.

In this case, unnecessary current consumption is avoided because the voltage booster 333 stops its operation when the battery is disconnected. Thus, the battery can be used longer.

Next, in response to the detection control signal DETCTRLS, control signals (not shown) received by the driving unit 330 are interrupted (operation S450). The operation S450 is performed by the microprocessor 335.

While the detection control signal DETCTRLS stays at the first level, the microprocessor 335 receives the external control signals to control the operation of the driving unit 330 and the panel 310. When the detection control signal DETCTRLS becomes the second level, however, the microprocessor 335 interrupts the control signals received by the driving unit 330. This is because the display device 300 need not perform any logic operations except for removing a latent image displayed on the panel 310 after the battery is disconnected. Thus, the battery can be used longer.

Next, by alternately activating the gate lines of the panel 310 in a specific order in response to the detection control signal DETCTRLS, the capacitor (not shown) of the panel 310 is discharged (operation S470). The operation S470 is performed by the source driver 337 and the panel 310.

The process of displaying an image on the panel 310 will now be described. When the gate lines are activated to turn on the transistors, color data is stored in capacitors connected to the transistors via the source lines, and the image is displayed on the panel 310 according to the electrical charges stored in the capacitors.

When the battery is disconnected, however, the image displayed on the panel 310 has to be promptly removed to prevent a latent image, by promptly discharging the capacitors. The discharging operation is performed in the operation S470.

The operation S470 will now be described in detail. In response to the detection control signal DETCTRLS, the voltage at the output node of each source line of the panel 310 becomes a ground voltage. This operation is performed by the source driver 337. More specifically, the source driver 337 makes the voltage at the output node of each source line of the panel 310 equal to the ground voltage in response to the detection control signal DETCTRLS at the second level.

Further, in response to the detection control signal DETCTRLS, the reference voltage applied to the internal capacitors of the panel 310 becomes the ground voltage. This operation is performed by the panel 310. More specifically, the panel 310 makes the reference voltage applied to the internal capacitors of the panel 310 equal to the ground voltage in response to the detection control signal DETCTRLS at the second level.

Further, in response to the detection control signal DETCTRLS, the gate lines of the panel 310 are alternately activated along with the aforementioned operations of the source driver 337 and the panel 310 in response to the detection control signal DETCTRLS of the second level. This operation is performed by the gate driver 315 included in the panel 310.

The gate driver 315 included in the panel 310 alternately activates the gate lines of the panel 310 in a specific order, instead of concurrently activating all the gate lines.

The method of activating the gate lines of the panel 310 including the gate driver 315 will now be described in detail. First, all the gate lines (n×k) of the panel 310 are divided into k groups each having n gate lines. Each of the first gate lines in the k groups is activated first. Each of the second gate lines in the k groups is then activated. In this way, all the gate lines of the panel 310 can be activated.

For example, if all the gate lines of the panel 310 are divided into a plurality of groups each having two gate lines, the first gate lines may be activated first, and the second gate lines may then be activated, thereby activating all gate lines of the panel 310.

In response to the detection control signal DETCTRLS, when the voltages of all source lines of the panel 310 and the reference voltage applied to the capacitors become the ground voltage, and the gate lines of the panel 310 are alternately activated, then the capacitors of the activated gate lines are instantly discharged through the source lines. Thus, the latent image displayed on the panel 310 can be removed after the battery is disconnected by alternately activating all of the gate lines.

Figure 5:
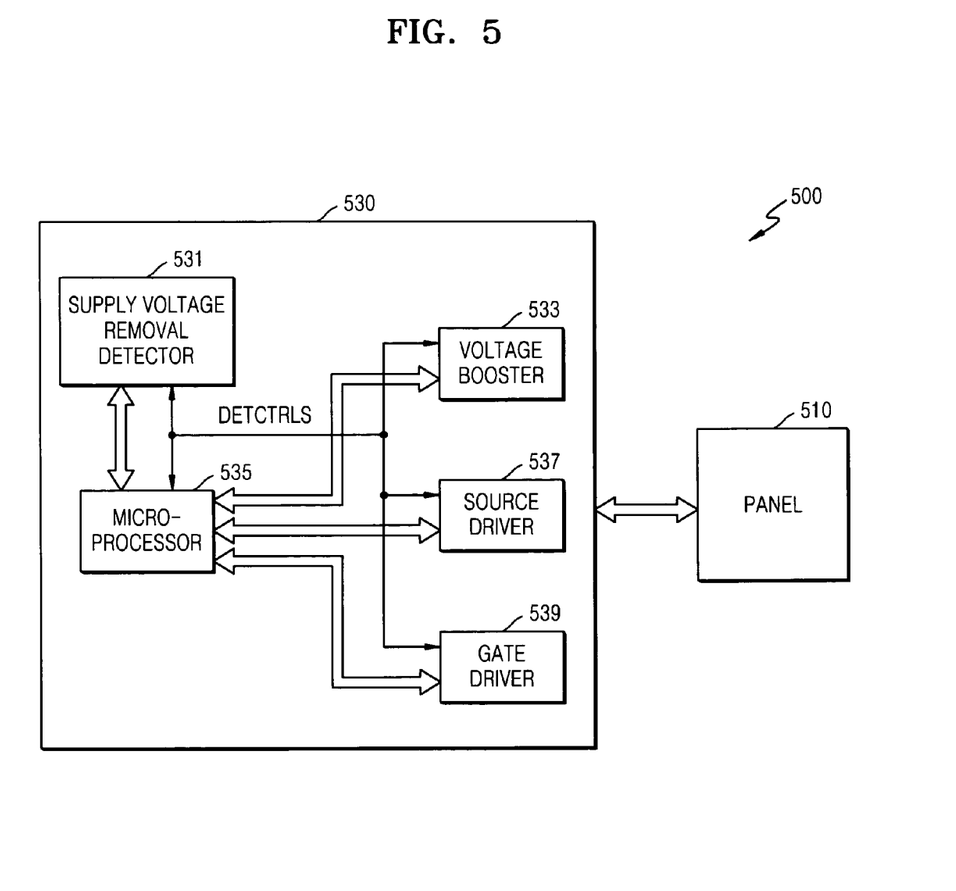
FIG. 5 is a block diagram of a display device according to an exemplary embodiment of the present invention.

FIG. 5 shows the structure of a display device according to an exemplary embodiment of the present invention. The display device 500 of FIG. 5 has the same structure as the display device 300 of FIG. 3 except that a gate driver 539 is included in a driving unit 530 instead of in a panel 510. Therefore, the following description will focus on the structure and operation of the gate driver 539 and the panel 510. For convenience, it is assumed that the gate driver 539 cannot concurrently activate the gate lines of the panel 510.

In order to discharge the internal capacitors (not shown) of the panel 510 when the battery is disconnected, the gate driver 539 alternately activates the gate lines of the panel 510 in a specific order in response to the detection control signal DETCTRLS at the second level.

Also, in response to the detection control signal DETCTRLS at the second level, the panel 510 makes the reference voltage applied to the internal capacitors of the panel 510 equal to the ground voltage.

By doing so, even though the gate driver 539 cannot concurrently activate the gate lines of the panel 510, the latent image can be removed from the panel 510 by discharging the capacitors of the panel 510 when the battery is disconnected.

In a supply voltage removal detecting circuit according to exemplary embodiments of the present invention, removal of a supply voltage is detected using internal capacitors, so that the size of the circuit can be reduced.

Further, a voltage used for detecting the removal of the supply voltage can be controlled by regulating a transistor threshold voltage and a resistance.

Meanwhile, in a display device according to exemplary embodiments of the present invention, a latent image displayed on a panel can be removed when the supply voltage is disconnected, even when the gate lines of the panel cannot be concurrently activated.

While the present invention has been particularly shown and described with reference to exemplary embodiments thereof, it will be understood by those skilled in the art that various changes in form and detail may be made therein without departing from the spirit and scope of the present invention as defined by the appended claims.

What is claimed is:

1. A detecting circuit for detecting removal of a supply voltage comprising:
    a voltage controller that controls voltages such that when a first supply voltage and a second supply voltage stay at a first level, a voltage at a first node is greater than a voltage at a second node, and when the first supply voltage or the second supply voltage becomes a second level, the voltage at the second node stays at a predetermined level, and the voltage at the first node is less than the predetermined level;
    a detection signal generator that generates a detection signal by comparing the voltage at the first node with the voltage at the second node in response to a boost voltage; and
    an output unit that prevents faulty operation of the voltage controller and the detection signal generator and inverts the generated detection signal in response to an operation enabling signal so as to output a detection control signal.

2. The circuit of claim 1, wherein the first supply voltage and the second supply voltage are generated by a battery, and
    when the battery is disconnected, the first supply voltage and the second supply voltage become the second level after a time delay.

3. The circuit of claim 1, wherein the detection signal generator outputs the detection signal at the second level when the voltage at the first node is greater than the voltage at the second node, and outputs the detection signal at the first level when the voltage at the first node is less than the voltage at the second node.

4. The circuit of claim 3, wherein the voltage controller comprises:
    a first resistor having one end connected to the first supply voltage;
    a first transistor that receives the second supply voltage through a gate thereof and having a first end connected to the first node;
    a second resistor connected in series between the other end of the first resistor and a second end of the first transistor;
    a third resistor having one end connected to the first node;
    a second transistor having a gate and a first end thereof connected to the other end of the third resistor;
    a fourth resistor having one end connected to a second end of the second transistor and the other end connected to a ground voltage;
    a third transistor having a gate connected to a node where the first resistor and the second resistor are connected and having a first end connected to the other end of the third resistor;
    a fourth transistor that receives the second supply voltage through a gate thereof and having a first end connected to a second end of the third transistor and a second end connected to the second node; and
    a capacitor connected between the second node and the ground voltage.

5. The circuit of claim 4, wherein the capacitor is charged in response to the voltage at the second node when the first supply voltage and the second supply voltage remain at the first level, and the voltage at the second node remains at the specific level when the first supply voltage or the second supply voltage becomes the second level.

6. The circuit of claim 1, wherein the detection signal generator comprises a comparator that operates in response to the boost voltage and having a negative input connected to the first node and a positive input connected to the second node, thereby generating the detection signal.

7. The circuit of claim 1, wherein the output unit comprises:
    a down shifting unit that reduces a voltage level of the detection signal;
    a delay unit that delays the output of the down shifting unit;
    a NOR gate that performs a NOR operation on an output of the delay unit and the output of the down shifting unit;

an AND gate that performs an AND operation on the operation enabling signal and an output of the NOR gate; and an inverter that inverts an output of the AND gate to output the detection control signal.

8. The circuit of claim 7, wherein the down shifting unit comprises a second inverter inverting the detection signal, and the inverter operates in response to the second supply voltage.

9. A method of detecting removal of a supply voltage comprising:

controlling voltages such that, when a first supply voltage and a second supply voltage generated by a battery remain at a first level, a voltage at a first node is greater than a voltage at a second node, and when the first supply voltage or the second supply voltage becomes a second level, the voltage at the second node remains at a predetermined level, and the voltage at the first node is less than the predetermined level;

generating a detection signal by comparing the voltage at the first node with the voltage at the second node in response to a boost voltage; and outputting a detection control signal by inverting the generated detection signal in response to an operation enabling signal.

10. The method of claim 9, wherein when the battery is disconnected, the first supply voltage and the second supply voltage become the second level after a time delay.

11. The method of claim 9, wherein the step of controlling voltages further comprises:

charging a capacitor connected between the second node and a ground voltage in response to the voltage at the second node when the first supply voltage and the second supply voltage remain at the first level; and maintaining the voltage at the second node at a constant level corresponding to an amount of electrical charge stored in the capacitor when the first supply voltage or the second supply voltage becomes the second level.

12. The method of claim 9, wherein the step of outputting a detection control signal comprises:

delaying the detection signal;

performing a NOR operation on the detection signal and the delayed detection signal;

performing an AND operation on an operation enabling signal and an output signal from the NOR operation; and outputting the detection control signal by inverting the signal output from the AND operation.

* * * * *